(12) United States Patent
Iketaki

(10) Patent No.: US 9,569,128 B2
(45) Date of Patent: Feb. 14, 2017

(54) STORAGE DEVICE AND DATA PROCESSING METHOD

(71) Applicant: KABUSHIKI KAISHA TOSHIBA, Tokyo (JP)

(72) Inventor: Taro Iketaki, Ome Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 145 days.

(21) Appl. No.: 14/552,316

(22) Filed: Nov. 24, 2014

(65) Prior Publication Data

US 2016/0004471 A1    Jan. 7, 2016

(30) Foreign Application Priority Data

Jul. 1, 2014    (JP) .................................. 2014-135795

(51) Int. Cl.
*G06F 12/00*    (2006.01)
*G06F 3/06*    (2006.01)

(52) U.S. Cl.
CPC ........... *G06F 3/0625* (2013.01); *G06F 3/0653* (2013.01); *G06F 3/0655* (2013.01); *G06F 3/0685* (2013.01)

(58) Field of Classification Search
CPC .. G06F 3/0625; G06F 12/0246; G06F 1/3203; G06F 1/3206
USPC .................................................. 711/154, 103
See application file for complete search history.

(56) References Cited

U.S. PATENT DOCUMENTS

| 8,917,471 B1* | 12/2014 | Hasfar | G11B 25/043 360/71 |
|---|---|---|---|
| 2007/0050571 A1 | 3/2007 | Nakamura et al. | |
| 2011/0051276 A1 | 3/2011 | Fukuyama | |
| 2014/0040650 A1 | 2/2014 | Hida et al. | |

OTHER PUBLICATIONS

Spector, Lincoln, Tweaking Windows 7's Sleeping Habits, PC World, Jun. 11, 2012, http://www.pcworld.com/article/256309/tweeking_windows_7s_sleeping_habits.html.*
Cocilova, Alex, How to stretch the life of your SSD storage, PC World, Jul. 17, 2013, http://www.pcworld.com/article/2043634/how-to-stretch-the-life-of-your-ssd-storage.html.*

* cited by examiner

*Primary Examiner* — Ryan Bertram
*Assistant Examiner* — Edmund Kwong
(74) *Attorney, Agent, or Firm* — Patterson & Sheridan, LLP

(57) ABSTRACT

A storage device includes a nonvolatile memory unit, a volatile memory unit, a power supply control unit configured to control power supply to the nonvolatile memory unit and the volatile memory unit, and a control unit configured to control the power supply unit to cut off the power supply to the nonvolatile memory unit and the volatile memory unit during a first operation, and control the power supply unit to cut off the power supply to the nonvolatile memory unit and to maintain the power supply to the volatile memory unit during a second operation that is different from the first operation.

20 Claims, 9 Drawing Sheets

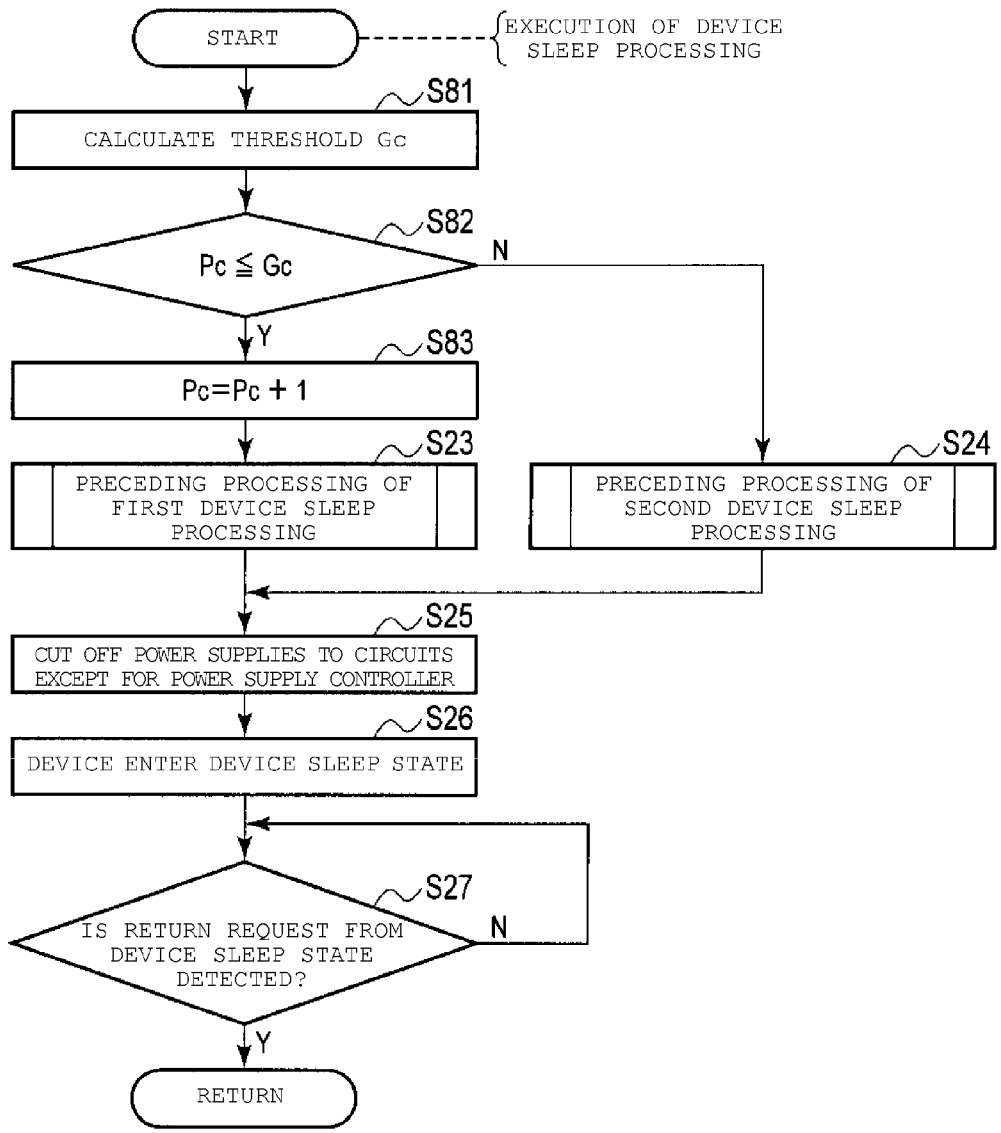

STORAGE DEVICE AND DATA PROCESSING METHOD

CROSS-REFERENCE TO RELATED APPLICATION

This application is based upon and claims the benefit of priority from Japanese Patent Application No. 2014-135795, filed Jul. 1, 2014, the entire contents of which are incorporated herein by reference.

FIELD

Embodiments described herein relate generally to a storage device and a data processing method thereof.

BACKGROUND

One type of a storage device has a device sleep function. The device sleep function is a function of entering a low power consumption state (hereinafter, device sleep state) in response to a trigger signal from a host. Before the storage device enters the device sleep state, data stored in volatile memory such as a DRAM or an SRAM is transferred to nonvolatile memory such as a NAND flash memory, and after that, power supply to the storage device is cut off.

However, each time the storage device enters the device sleep state, the data in the volatile memory is transferred to the nonvolatile memory. As the writing in the nonvolatile memory is carried out each time, the performance of the nonvolatile memory becomes lower.

DESCRIPTION OF THE DRAWINGS

FIG. 10 is a flow chart illustrating an execution of device sleep processing according to the fourth embodiment.

DETAILED DESCRIPTION

Exemplary embodiments provide a storage device which can suppress performance degradation of a nonvolatile semiconductor memory and a data processing method.

In general, according to one embodiment, a storage device includes a nonvolatile memory unit, a volatile memory unit, a power supply control unit configured to control power supply to the nonvolatile memory unit and the volatile memory unit, and a control unit configured to control the power supply unit to cut off the power supply to the nonvolatile memory unit and the volatile memory unit during a first operation, and control the power supply unit to cut off the power supply to the nonvolatile memory unit and to maintain the power supply to the volatile memory unit during a second operation that is different from the first operation.

In a so-called hybrid hard disk device (hereinafter, hybrid drive) in which a hard disk device and a NAND flash memory are mounted, when the hybrid drive enters a device sleep state, in order to reduce power consumption, power supply to a volatile memory, such as a static RAM or a synchronous DRAM (SDRAM) is cut off. In this case, management information or the like stored in a system area of a volatile memory is transferred to a nonvolatile memory such as a NAND flash memory, or to a hard disk, for a back-up.

In order to reduce time to return from a device sleep state, it is necessary to back-up management information or the like in the NAND flash memory, not in the hard disk device. However, if the device sleep operation is frequently executed, writing to the NAND flash memory is frequent. As a result, within a product operation guarantee period, writing times in the NAND flash memory may reach a maximum limit. Therefore, exemplary embodiments are to suppress performance degradation of the NAND flash memory caused by the execution of device sleep processing.

Hereinafter, embodiments will be described with reference to the drawings.

First Embodiment

Configuration of Hybrid Drive

Figure 1:
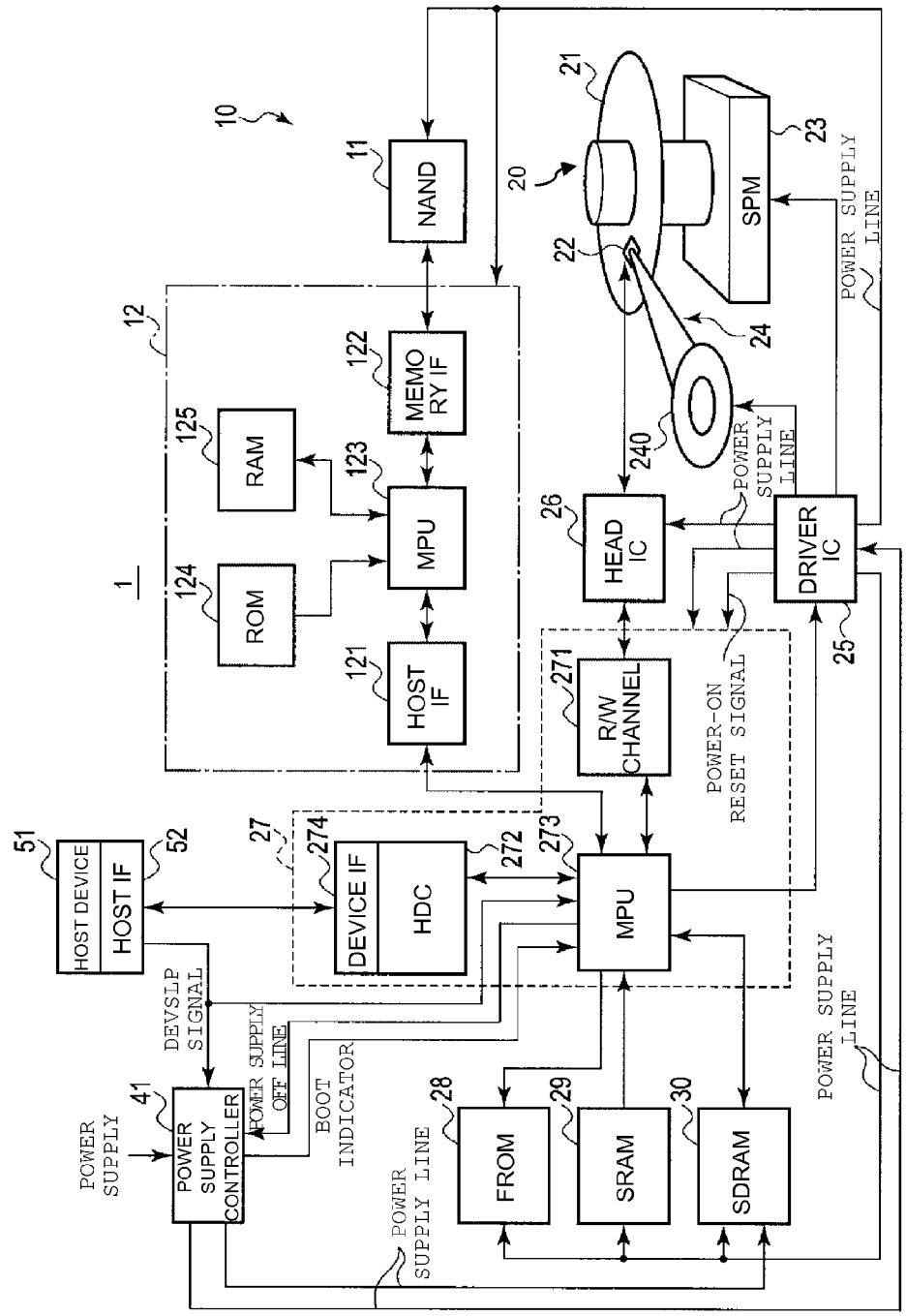
FIG. 1 is a diagram illustrating an example of a storage device according to a first embodiment.

FIG. 1 illustrates a configuration example of a storage device, that is, a hybrid drive 1, according to a first embodiment. The hybrid drive 1 is usually mounted on an electronic apparatus, such as a personal computer, a video camera, a music player, a mobile terminal, a mobile phone, a tablet terminal, and a printer apparatus.

The hybrid drive 1 includes a semiconductor drive unit 10, such as a solid state drive (SSD), and a magnetic disk drive unit 20.

Semiconductor Drive Unit 10

The semiconductor drive unit 10 includes a NAND flash memory (hereinafter, NAND memory) 11, and a memory controller 12.

The NAND memory 11 is used as a cache memory for storing the data accessed by a host device 51. Due to this, when the hybrid drive 1 is used as a storage device, the host device 51 may access the storage device at a high speed. The NAND memory 11 includes a memory cell array as a memory area in which a plurality of memory cells (not illustrated) are disposed. The memory cell array includes a plurality of blocks, which is a unit of data erasing, and is divided into a system area and a cache area.

According to an access command (for example, a write command or a read command) from a main controller 27, the memory controller 12 controls an access to the NAND memory 11. The memory controller 12 includes a host interface controller (hereinafter, host IF) 121, a memory interface controller (hereinafter, memory IF) 122, a micro processor unit (MPU) 123, a read only memory (ROM) 124, and a random access memory (RAM) 125.

The host IF 121 is electrically connected to the main controller 27, receives a signal transferred from the main controller 27, and transmits a signal to the main controller 27. Specifically, the host IF 121 receives a command (a write command, a read command or the like) transferred from the main controller 27, and transfers the command to the MPU 123. In addition, the host IF 121 sends a response of the MPU 123 in response to the command transferred from the main controller 27 to the main controller 27. In this manner, the host IF 121 controls a data transfer between the main controller 27 and the MPU 123.

The memory IF 122 is electrically connected to the NAND memory 11, and accesses the NAND memory 11 according to the control of the MPU 123.

The MPU 123, based on the command transferred from the main controller 27, executes access processing (for example, write processing or read processing) to the NAND memory 11 according to a predetermined control program.

The ROM 124 stores in advance a control program for the MPU 123 to execute the access processing therein.

The RAM. 125 temporarily stores required data. A portion of the memory area of the RAM 125 is used as a work area of the MPU 123.

Magnetic Disk Drive Unit 20

A magnetic disk drive unit 20 includes a disk 21, a head 22, a spindle motor (SPM) 23, an actuator 24, a driver integrated circuit (IC) 25, a head IC 26, the main controller 27, a flash ROM (FROM) 28, a static RAM (SRAM) 29, and a synchronous DRAM (SDRAM) 30.

The disk 21 as the nonvolatile memory has a recording surface on which data is magnetically recorded, for example in one surface thereof. The disk 21 is rotated at a high speed by the SPM 23. The SPM 23 is driven by a driving current (or driving voltage) which is supplied from the driver IC 25. The recording surface of the disk 21 has a plurality of tracks which are disposed in a concentric fashion or in a spiral shape.

The head (head slider) 22 is disposed corresponding to the recording surface of the disk 21. The head 22 is disposed at a front edge of a suspension which protrudes from an arm of the actuator 24. The actuator 24 includes a voice coil motor (VCM) 240, which is a driving source of the actuator 24. The VCM 240 is driven by a driving current (or driving voltage) supplied from the driver IC 25. According to the actuator 24 being driven by the VCM 240, the head 22 moves so as to draw an arc over the disk 21 in a radius direction of the disk 21.

Meanwhile, FIG. 1 illustrates a configuration in which one disk 21 is included. However, a plurality of disks 21 may be disposed in a stacked manner. In addition, in FIG. 1, the disk 21 has the recording surface in one surface thereof. However, the recording surfaces may be formed in both surfaces of the disk 21, and the head may be disposed corresponding to each of both recording surfaces.

The driver IC 25 drives the SPM 23 and the VCM 240, according to the control of the main controller 27. When the VCM 240 is driven by the driver IC 25, the head 22 is positioned over a target track on the disk 21. Furthermore, the driver IC 25 receives a power supply voltage from a power supply controller 41, and as will be described later, supplies the power supply voltage to each unit.

The head IC 26 is disposed at a position separated from the actuator 24 in FIG. 1, but is fixed to a predetermined portion of the actuator 24, for example, and is electrically connected to the main controller 27 via a flexible print circuit board (FPC). The head IC 26 amplifies a read signal which is read by a read element of the head 22. In addition, the head IC 26 converts write data which is supplied from the main controller 27 into a write current, and outputs the write current to a write element of the head 22.

The main controller 27 is achieved by a large scale integrated circuit (LSI) in which, for example, a plurality of components are integrated in a single chip. The main controller 27 includes a read and write (R/W) channel 271, a hard disk controller (HDC) 272, and an MPU 273.

The R/W channel 271 processes a signal relating to read and write. That is, the R/W channel 271 converts the read signal amplified by the head IC 26 into digital data, and decodes read data from the digital data. In addition, the R/W channel 271 encodes the write data which is supplied from the HDC 272 via the MPU 273, and transfers the encoded write data to the head IC 26.

An HDC 272 is electrically connected to a host interface (host IF) 52 of the host device 51 via a device interface (device IF) 274. The device IF 274 receives a signal transferred from the host device 51, and transfers a signal to the host device 51. Specifically, the HDC 272 receives an access command (a write command, a read command or the like) which is transferred from the host device 51, and transfers the received command to the MPU 273. The HDC 272 controls the data transfer between the host device 51 and the HDC 272. The HDC 272 also functions as a disk interface controller which controls writing to the disk 21 and reading from the disk 21, via the MPU 273, the R/W channel 271, the head IC 26, and the head 22.

The MPU 273 controls an access to the NAND memory 11 through the memory controller 12, and controls an access to the disk 21 through the R/W channel 271, the head IC 26, and the head 22, according to an access command (a write command, or a read command) from the host device 51.

In addition, the MPU 273, based on a device sleep (DEVSLP) signal which is supplied from the host device 51, controls the power supply controller 41, and executes the device sleep processing, which will be described later.

The above-described operation of the MPU 273 is executed in accordance with a firmware stored in the FROM 28.

A portion of the memory area of the SRAM 29 is used as a work area of the MPU 273, in which the data or the like stored in a system area of the NAND memory 11 is temporarily retained.

The SDRAM 30 temporarily retains the data or the like stored in the system area of the NAND memory 11.

The power supply controller 41, based on a request which is supplied from the MPU 273 or the host device 51, controls the power supply to the hybrid drive 1. That is, the power supply controller 41 is connected to the host device 51 via the host IF 52, and is connected to the MPU 273 of the main controller 27, the driver IC 25 of the magnetic disk drive unit 20, and the SDRAM 30. The power supply controller 41 supplies a power supply voltage to the driver IC 25, and the SDRAM 30. The driver IC 25 applies the power supply voltage from the power supply controller 41 to the NAND memory 11, the memory controller 12, the head IC 26, the main controller 27, the FROM 28, the SRAM 29, and the SDRAM 30. Furthermore, when the power supply voltage is applied, the driver IC 25 supplies a power-on reset signal to the main controller 27.

In addition, as will be describe later, when entering the device sleep state, the power supply controller 41 cut off the power supply to each unit. When returning from the device sleep state, the power supply controller 41 generates a boot indicator signal, according to negating of the DEVSLP signal which is supplied from the host device 51, and supplies the generated signal to the MPU 273. The boot indicator signal includes information on whether or not the power supply voltage is applied to the SDRAM 30 in the device sleep state. The MPU 273, based on the boot indicator signal which is supplied from the power supply controller 41, determines whether or not to be normally powered on or returned from the device sleep state.

Meanwhile, an example in which the above-described hybrid drive 1 includes two nonvolatile memories of the disk 21 and the NAND memory 11, is illustrated. However, the hybrid drive 1 is not limited to this, and may be configured with a plurality of kinds of nonvolatile memories in which an access speed or a memory capacity is different from each other.

Sequence of Device Sleep Processing

Figure 2:
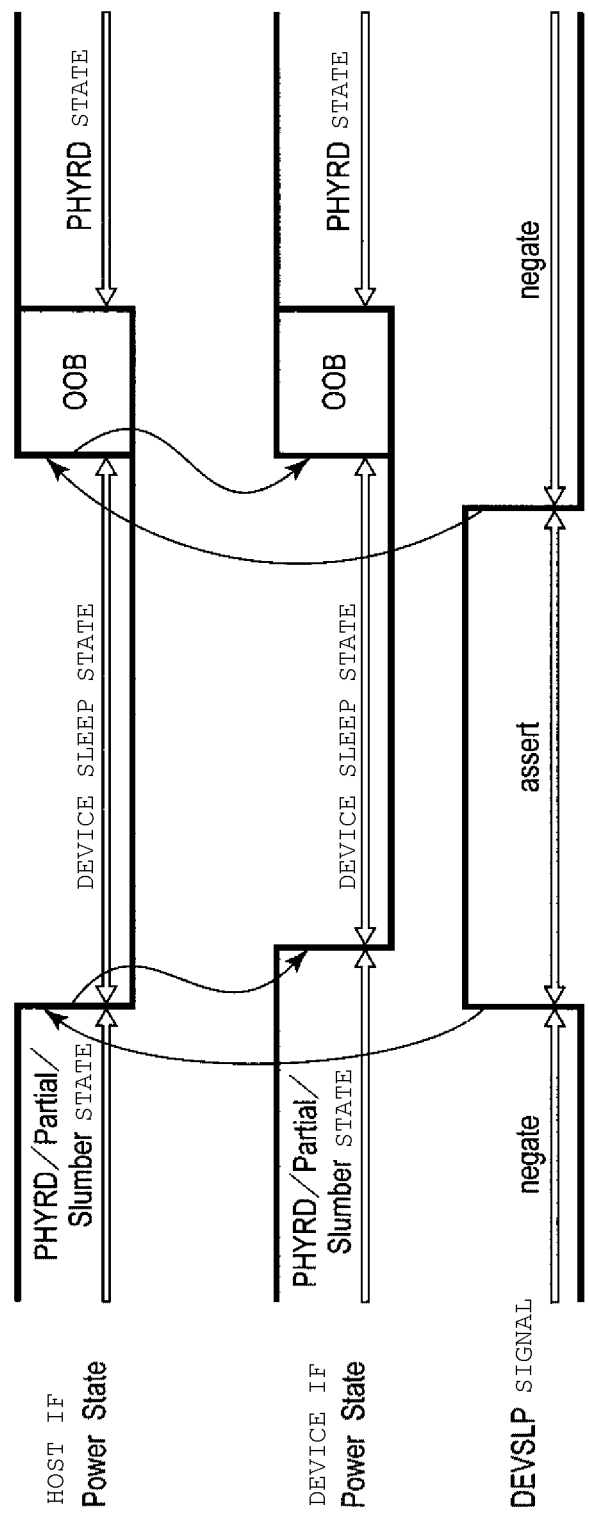
FIG. 2 is a sequence chart illustrating a sequence of device sleep processing.

FIG. 2 schematically illustrates a sequence of device sleep processing.

As illustrated in FIG. 2, when a status of hybrid drive 1 is a state of PHYRDY, Partial, or Slumber, a state of the DEVSLP signal which is supplied from the host device 51 is in a negative state. At this time, if the DEVSLP signal is asserted, the MPU 273 executes a preparation for entering the device sleep state. In addition, as will be described later, if the DEVSLP signal is asserted, preceding processing for entering the device sleep state is executed by the MPU 273 and the power supply controller 41, and after that, the power of the hybrid drive 1 which includes the device IF 274 is turned off. Due to this, the device IF 274 enters the device sleep state later than the host IF 52.

In the present embodiment, as will be described later, the device sleep processing includes a case where the power supply to the SDRAM 30 is cut off (hereinafter, first device sleep processing), and a case where the power supply to the SDRAM 30 is not cut off (hereinafter, second device sleep processing).

In a case of the first device sleep processing, the data retained in the SRAM 29 and the SDRAM 30 is backed up in the NAND memory 11. In addition, in a case of the second device sleep processing, the data stored in the SRAM 29 is backed up in the SDRAM 30. The second device sleep processing may reduce the number of writing to the NAND memory 11.

After this preparation is finished, the MPU 273 issues a power-off request with respect to the power supply controller 41. In a case of the second device sleep processing, the power supply controller 41 cuts off the power supply to the driver IC 25 according to the request, and thereby the hybrid drive 1 is powered off and enters the device sleep state, except for the power supply controller 41 and the SDRAM 30.

Meanwhile, in a case of returning from the device sleep state, if the state of the DEVSLP signal which is supplied to the power supply controller 41 from the host device 51 is negative state, the power supply controller 41 starts the power supply to the driver IC 25. The driver IC 25 applies the power supply voltage to the main controller 27, the FROM 28, the SRAM 29, and the SDRAM 30, and supplies the power-on reset signal to the main controller 27. The main controller 27 starts the firmware by executing the power-on processing. The MPU 273 of the main controller 27 determines whether the hybrid drive 1 is normally powered on or the hybrid drive 1 is returned from the device sleep state, according to the boot indicator signal which is supplied from the power supply controller 41. As a result, in a case of returning from the device sleep, the data backed up in the NAND memory 11 or the SDRAM 30 is restored in the SRAM 29. After that, the MPU 273 stands by for out-of-band (OOB: for example, COMRESET or COMWAKE) from the host device 51, and if the OOB is detected, enters the PHYRDY state.

Condition for Performing Second Device Sleep Processing

As described above, the present embodiment includes the first and second device sleep processings. When entering the device sleep state, if anyone of the following conditions (1), (2), and (3) is satisfied, the second device sleep processing is executed in which the power supply controller 41 does not cut off the power supply to the SDRAM 30, the MPU 273 stores management information or the like of the system area (hereinafter, data) in the SDRAM 30, instead of in the NAND memory 11.

(1) Time Dt between the time when returned from the preceding first device sleep processing and the present time does not exceed a retainable interval (time) Mt of the data in the NAND memory 11.

(2) The total number Tc of times the first device sleep processing is executed exceeds a threshold value Fc.

(3) The number Pc of times the first device sleep processing is executed within an arbitrary time interval "It" exceeds a threshold Gc.

By executing the second device sleep processing using one of the above-described conditions (1), (2), and (3), it is possible to suppress the number of writing in the NAND memory 11, even if the device sleep request issued from the host device 51 is frequent.

In addition, by adjusting the values of the time Mt, the threshold Fc, and the threshold Gc, within a range which satisfies the product operation guarantee period in which the maximum limit of the rewriting times to the NAND memory 11 is considered, it is possible to cause the hybrid drive 1 to execute the first device sleep processing in response to the device sleep request of the host device 51.

Meanwhile, one of the above-described conditions (1), (2), and (3) may be used, or two or more of them may be used for the condition triggering the second device sleep processing. In the following embodiments, a case where each one of the conditions (1), (2), and (3) is used for the triggering condition will be described.

Second Embodiment

In a second embodiment, whether the condition (1) is met is determined, and the first device sleep processing or the second device sleep processing is executed accordingly.

An example of a calculation method of the retainable interval Mt of the management information or the like which is used for the condition (1) will be illustrated in the following description.

If the number of rewritable times with respect to the NAND memory 11 is defined as Nc, the size (Byte) of an area of the NAND memory 11 which is secured for retaining the management information or the like of the system area is defined as Ns, a retention size (Byte) of the management information or the like of the system area per device sleep is defined as Ss, and the number of retainable times of the management information or the like of the system area is defined as Sc, the number of retainable times Sc is represented by the following Formula (1).

$$Sc = (Nc \times Ns)/Ss \quad (1)$$

If the product operation guarantee period (time) is Lt, the retainable interval (time) Mt of the management information or the like of the system area is represented by the following Formula (2).

$$Mt = Lt/Sc \quad (2)$$

$$= Lt/((Nc \times Ns)/Ss)$$

By executing the second device sleep processing (data is not retained in the NAND memory 11, and power supply voltage is not applied to the SDRAM 30) without writing to NAND memory 11, as long as the following Formula (3) is not satisfied, even if there is a device sleep request from the host device 51, it is possible to satisfy the product operation guarantee period.

$$Dt \geq Mt \quad (3)$$

Here, Dt is the time between the time when returned from the preceding first device sleep processing (data is retained in the NAND memory 11 and power is off) and the present time.

For example, if Nc=10,000 times, Ns=2 GB, Ss=2 MB, and Lt=26,280 hours (three years), the retainable times Sc of the management information or the like which is retained in the system area becomes as follows from Formula (1).

$$Sc=(Nc \times Ns)/Ss=10,000,000 \text{ times}$$

The retainable interval (time) Mt of the management information or the like which is retained in the system area becomes as follows from Formula (2).

$$Mt = Lt/Sc$$

$$= 26,280 \text{ hours}/10,000,000 \text{ times}$$

$$= 9.46 \text{ seconds}$$

Accordingly, even if the first device sleep processing is executed by one per 9.46 seconds in a shortest time, it is possible to satisfy the product operation guarantee period.

Operation of Second Embodiment

An operation of the second embodiment which uses the condition (1) will be described with reference to FIGS. 3 to 7.

Figure 3:
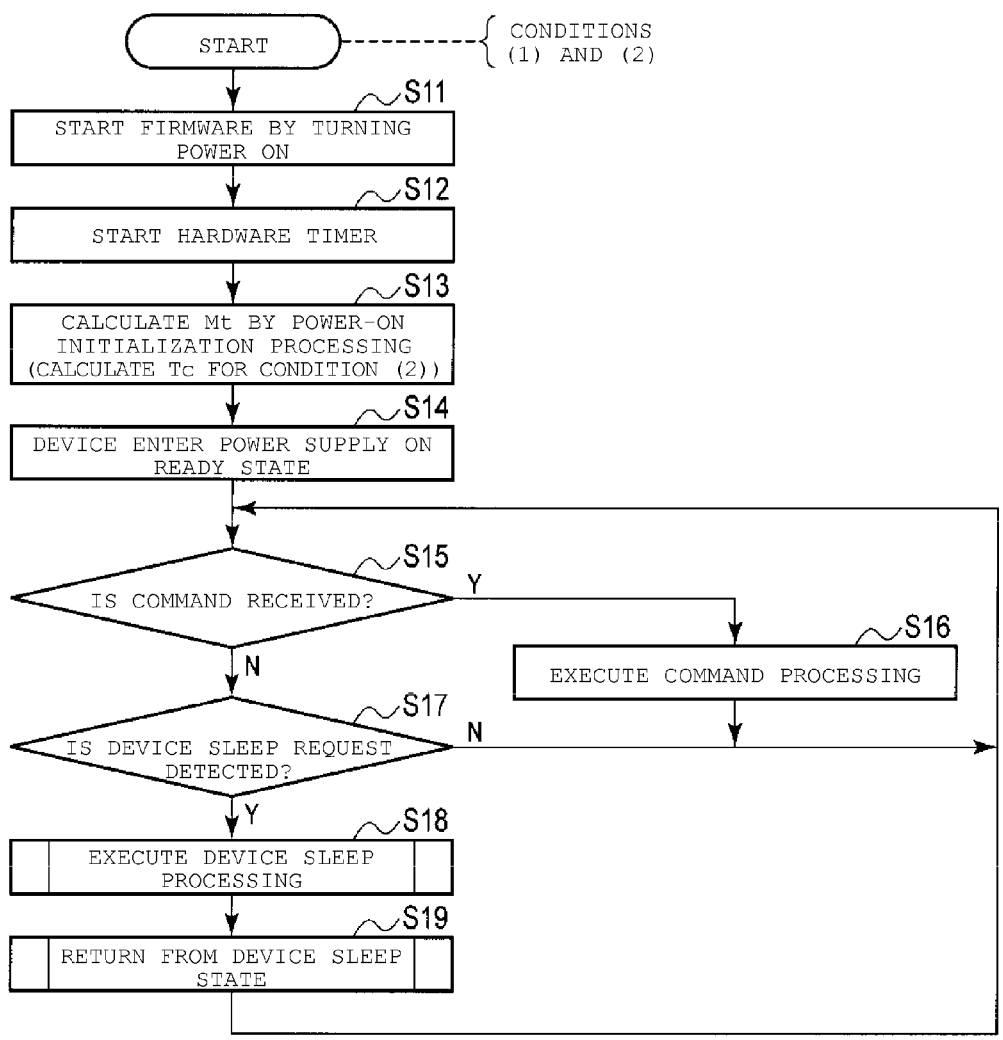
FIG. 3 is a flow chart schematically illustrating an operation according to a second embodiment.

As illustrated in FIG. 3, if the power of the hybrid drive 1 is turned on, the power supply controller 41 starts the power supply to the driver IC 25. The driver IC 25 applies the power supply voltage to the main controller 27, and supplies the power-on reset signal. The main controller 27 executes power-on initialization processing, thereby starting the firmware (S11). The MPU 273 of the main controller 27 determines that the power-on is a normal power-on based on the boot indicator signal which is supplied from the power supply controller 41.

After that, an operation of a hardware timer (not illustrated) which is built in, for example, the MPU 273, is started, and time is measured (S12). Meanwhile, while not being limited to the hardware timer, a software timer may be used.

Subsequently, by the power-on initialization processing, the retainable interval (time) Mt of the management information or the like of the system area of the NAND memory 11 is calculated (S13).

After the above-described retainable interval Mt is calculated, the MPU 273 enters a ready state (S14).

After that, whether or not the command issued by the host device 51 is received is determined (S15). As a result, if it is determined that the command is received, processing corresponding to the command is executed (S16). For example, if a write command is received, data write processing is executed according to the write command. After that, the control proceeds to step S15.

On the other hand, if the command is not received, whether or not the device sleep request issued by the host device 51 is detected is determined (S17). That is, whether or not the DEVSLP signal is asserted is determined. As a result, if the DEVSLP signal is not asserted, the control proceeds to step S15.

Meanwhile, if it is determined that the DEVSLP signal is asserted, the device sleep processing is executed (S18).

Figure 4:
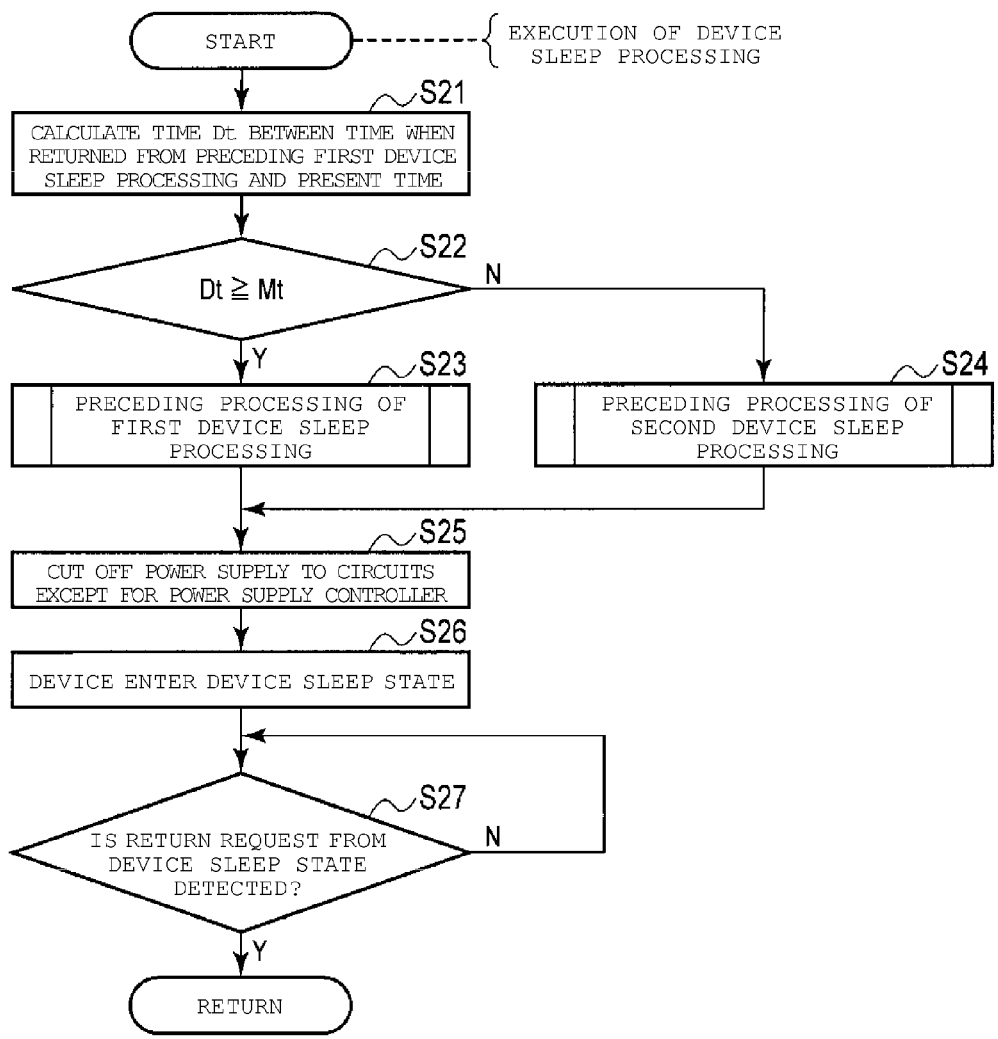
FIG. 4 is a flow chart illustrating an execution of the device sleep processing according to the second embodiment.

FIG. 4 illustrates the execution of the device sleep processing according to the second embodiment.

In FIG. 4, the time Dt between the time when returned from the preceding first device sleep processing and the present time is first calculated (S21). The time Dt is calculated using the time measured by, for example, the hardware timer. The time when returned from the preceding first device sleep processing is retained in, for example, the NAND memory 11 or the disk 21, and this time is read in the power-on initialization processing.

Next, whether or not the time Dt exceeds the retainable interval (time) Mt of the management information or the like of the system area is determined (S22). As a result, if it is determined that the time Dt is equal to or exceeds the time Mt, preceding processing of the first device sleep processing is executed (S23). If it is determined that the time Dt does not exceed the time Mt, preceding processing of the second device sleep processing is executed (S24).

Figure 5:
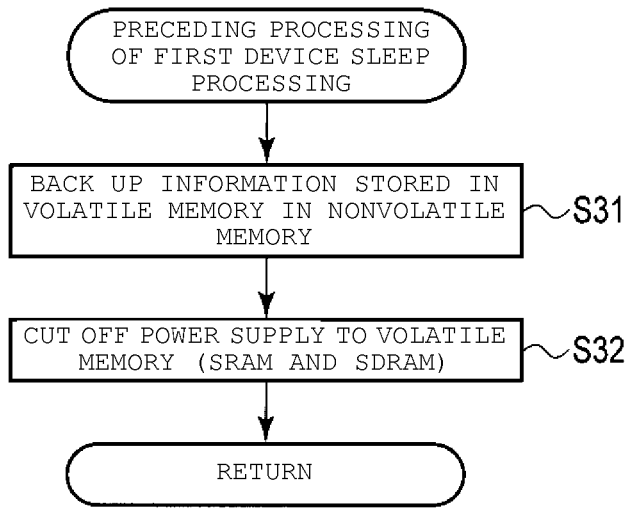
FIG. 5 is a flow chart illustrating processing that precedes first device sleep processing.

FIG. 5 illustrates an example of preceding processing of the first device sleep processing.

In the preceding processing of the first device sleep processing, the management information or the like retained in the SRAM 29 and the SDRAM 30, which are volatile memories, is first backed up in the system area of the NAND memory 11, which is a nonvolatile memory (S31).

After that, the power supplies of the SRAM 29 and the SDRAM 30 are cut off by the power supply controller 41 (S32).

Figure 6:
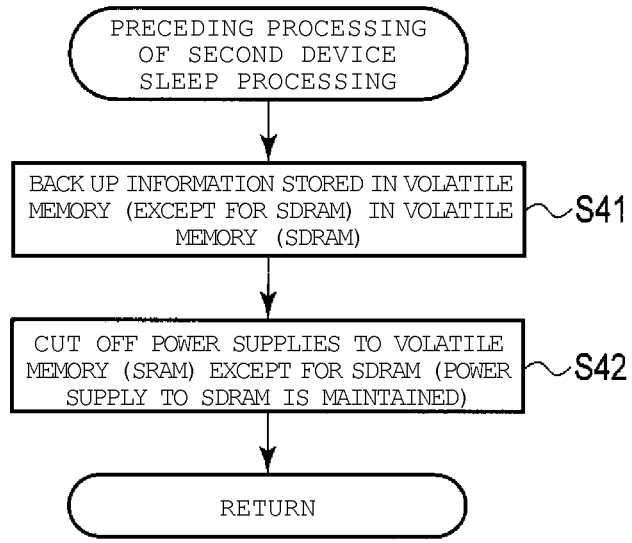
FIG. 6 is a flow chart illustrating processing that precedes second device sleep processing.

FIG. 6 illustrates an example of preceding processing of the second device sleep processing.

In the preceding processing of the second device sleep processing, the data retained in the SRAM 29, which is a volatile memory, is first backed up in the SDRAM 30 (S41).

After that, the power supply to the SRAM 29 is cut off by the power supply controller 41, and the power supply to the SDRAM 30 is maintained (S42).

After the preceding processing of the above-described first or second device sleep processing is executed, the control proceeds to step S25 as illustrated in FIG. 4. In step S25, the power supplies to circuits except for the volatile memory and the power supply controller 41 are cut off. That is, if the preceding processing S23 of the first device sleep processing is executed, the power supply to the SRAM 29 and the SDRAM 30 has been already cut off. In this state, the power supplies to the circuits except for the power supply controller 41 are cut off. In addition, if the preceding processing S24 of the second device sleep processing is executed, the power supply to the SRAM 29 has been already cut off, and the power supply to the SDRAM 30 is maintained. In this state, the power supplies to the circuits except for the SDRAM 30 and the power supply controller 41 are cut off. In this manner, the power supplies to the circuits except for the power supply controller 41 are cut off, and the device sleep state is performed (S26).

In the device sleep state, whether or not a return request from the device sleep state is detected by the power supply controller 41 is determined (S27). That is, the power supply controller 41 is in a detection stand-by state of the negative state of the DEVSLP signal supplied from the host device 51. In this state, if the negative state of the DEVSLP signal is detected by the power supply controller 41, the control proceeds to a return operation from the device sleep state as illustrated in step S19 of FIG. 3.

Figure 7:
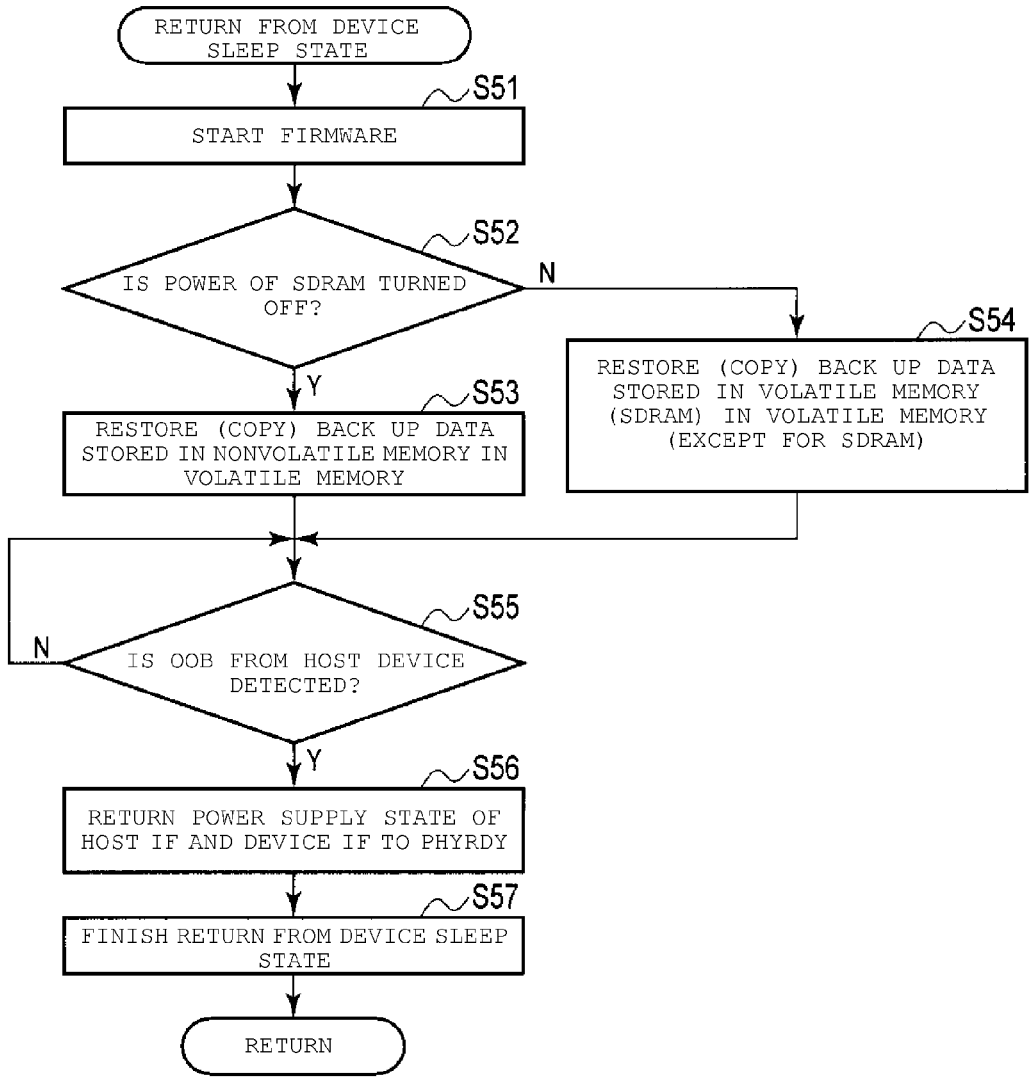
FIG. 7 is a flow chart illustrating an example of a returning operation from a device sleep state.

FIG. 7 illustrates an example of the return operation from the device sleep state.

If the DEVSLP signal which is supplied from host device 51 to the power supply controller 41 is in the negative state, the power supply controller 41, as described above, starts the power supply to the driver IC 25. The driver IC 25 applies the power supply voltage to the main controller 27, the FROM 28, the SRAM 29, the SDRAM 30, and the like, and supplies the power-on reset signal to the main controller 27. The main controller 27 starts the firmware by executing the power-on processing (S51).

The MPU 273 of the main controller 27 determines whether the hybrid drive 1 is normally powered on, or the hybrid drive 1 is returned from the device sleep state, using the boot indicator signal which is supplied from the power supply controller 41. As a result, in a case of return from the device sleep, whether or not the power supply to the SDRAM 30 is disconnected is determined (S52). This determination is performed based on the information on whether or not the power supply voltage is applied to the SDRAM 30 in the device sleep state included in the boot indicator signal. As a result, if the power supply to the SDRAM 30 is cut off, it is determined to return from the first device sleep processing, and the data backed up in the NAND memory 11 is read and restored in the SRAM 29 and the SDRAM 30 (S53). In addition, if the power supply to the SDRAM 30 is not cut off, it is determined to return from the second device sleep processing, and the data backed up in the SDRAM 30 is read and restored in the SRAM 29 (S54).

After that, detection stand-by for the GOB from the host device 51 is performed (S55). In this state, if the GOB is detected, the power supply states of the host IF and the device IF are returned to the PHYRDY state (S56), and are returned from the device sleep state (S57).

According to the above-described second embodiment, when entering the device sleep state, whether or not the time Dt between the time when returned from the preceding device sleep state and the present time exceeds the retainable interval (time) Mt of the management information or the like of the system area, is determined. If the time Dt does not exceeds the time Mt, the data retained in the SRAM 29 is not backed up in the NAND memory 11 by the second device sleep processing, and is backed up in the SDRAM 30 to which the power supply voltage is continuously supplied. Due to this, it is possible to reduce the number of writing times in the NAND memory 11, and to suppress performance degradation of the NAND memory 11.

In addition, the retainable interval (time) Mt of the management information or the like retained in the system area, the threshold Fc, and the threshold Gc are adjustable. Due to this, within a range which satisfies the product operation guarantee period in which the maximum limit of the rewriting times to the NAND memory 11 is considered, it is possible to execute the first device sleep processing according to the device sleep request of the host device 51. Thus, it is possible to vary the time period required until the first device sleep processing is executed, and to achieve both prevention of the performance degradation of the NAND memory 11 and power consumption reduction.

Third Embodiment

In the second embodiment, based on the condition (1), whether the first device sleep processing is executed or the second device sleep processing is executed, is determined. In a third embodiment, based on the condition (2) instead, and thereby the first device sleep processing or the second device sleep processing is executed.

In the above-described condition (2), whether or not the total number Tc of times the first device sleep processing is executed exceeds the threshold Fc is determined.

An example of a calculation method of the threshold Fc which is used for the condition (2) is illustrated in the following description.

Here, if the total power-on life time is defined as PLt, the threshold Fc is represented by the following Formula (4).

$$Fc = Sc \times (PLt/Lt) \quad (4)$$

Here, Sc represents the retainable times of the management information or the like of the system area, and Lt represents the product operation guarantee period (time).

Here, if Sc of Formula (4) is substituted with Formula (1), the threshold Fc is represented by following Formula (5).

$$Fc = ((Nc \times Ns)/Ss) \times (PLt/Lt) \quad (5)$$

Here, Nc represents the rewritable times for the NAND memory 11, Ns represents the size of an area on the NAND memory 11 which is secured for retaining the management information or the like of the system area, and Ss represents the retention size of the management information or the like of the system area per the device sleep.

Thus, if the total number Tc of times the first device sleep processing is executed until now, that is, the total number Tc of times the management information or the like of the system area is retained in the NAND memory 11 does not exceeds the threshold Fc, it is possible to continuously execute the first device sleep processing.

For example, if the retainable times Sc of the management information or the like of the system area is 10,000,000 times, the total power-on life time PLt is 10 hours, and the product operation guarantee period Lt is 26,280 hours (three years), the threshold Fc is calculated as follows from Formula (5).

$$Fc = 10{,}000{,}000 \text{ times} \times (10 \text{ hours}/26{,}280 \text{ hours})$$
$$= 3{,}805 \text{ times}$$

That is, if the total power-on life time PLt of the hybrid drive 1 is 10 hours and the first device sleep processing is not executed during the 10 hours at all, it is possible to continuously execute the first device sleep processing, even if there is a device sleep request of 3,805 times. That is, it is possible to vary the time period required until executing the first device sleep processing is possible for the next time, unlike the case of the condition (1).

Meanwhile, the total number Tc of times the device sleep state is entered is increased each time the first device sleep processing is executed.

Operation of Third Embodiment

An operation of a third embodiment in which the condition (2) is used will be described with reference to FIGS. 3 and 8. Meanwhile, the same signs and reference numerals will be attached to the same parts as in the second embodiment, and description thereof will be omitted.

As illustrated in FIG. 3, if the power supply to the hybrid drive 1 is on, the firmware is started in step S11, and the operation of the hardware timer is started in step S12. After that, by the power-on initialization processing, the total number Tc of times the first device sleep processing is executed is calculated (S13). The total number Tc is calculated based on the recording of operation log, for example. After the operation, the hybrid drive 1 enters a ready state (S14).

Subsequently, steps S15 to S17 are executed, and in step S17, if the device sleep request is detected, the device sleep is executed (S18).

Figure 8:
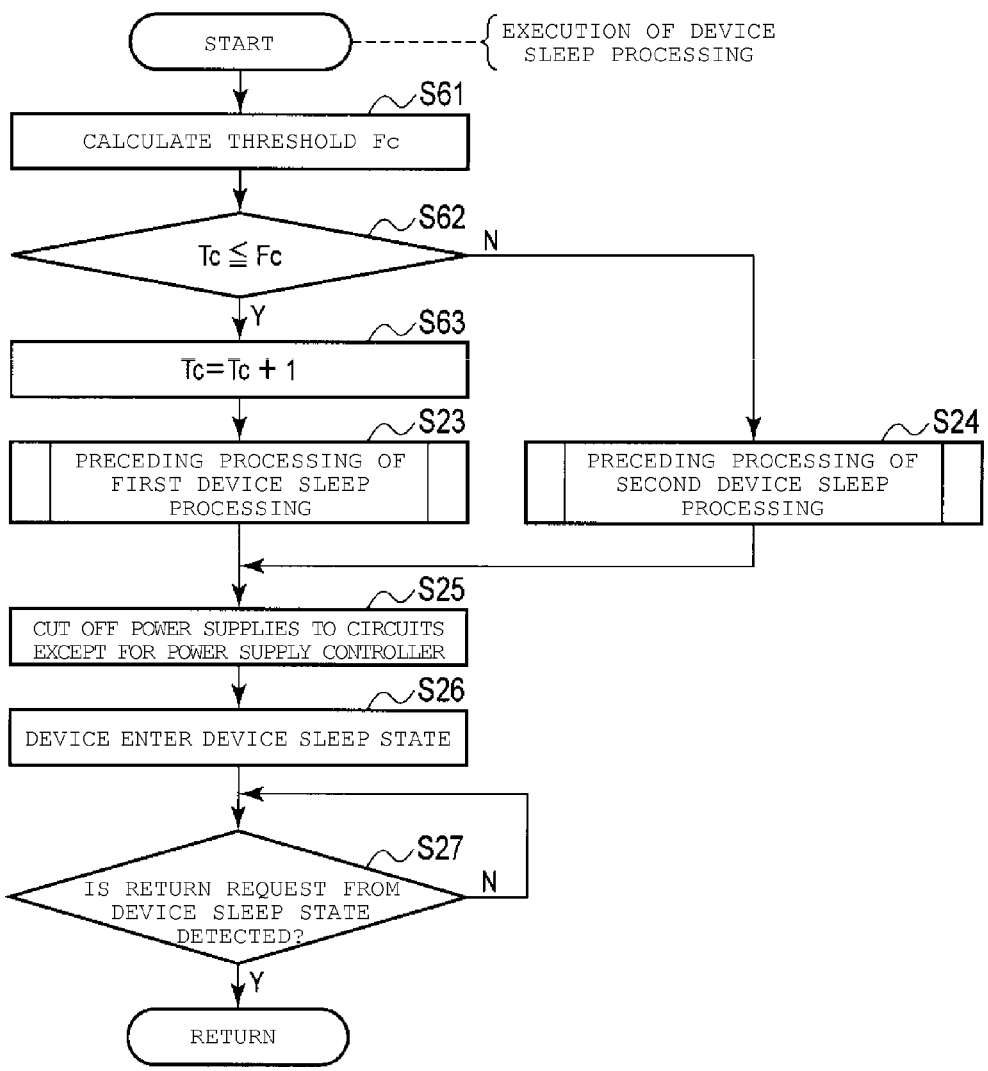
FIG. 8 is a flow chart illustrating an execution of device sleep processing according to a third embodiment.

FIG. 8 illustrates an execution of the device sleep processing according to the third embodiment.

In FIG. 8, the threshold Fc is first calculated using the above-described Formula (5) (S61). After that, whether or not the total number Tc of times the device sleep state is entered does not exceed the threshold Fc is determined (S62). As a result, if the total number Tc does not exceed the threshold Fc, the total number Tc is increased (S63), and the preceding processing of the first device sleep processing illustrated in FIG. 5 is executed (S23). Meanwhile, if the total number Tc exceeds the threshold Fc, the preceding processing of the second device sleep processing illustrated in FIG. 6 is executed (S24).

In this manner, after the preceding processing of the first or second device sleep processing is executed, the hybrid drive 1 enters the device sleep state after step S25 (S26). After that, if a return request from the device sleep state is detected (S27), return processing from the device sleep is executed by step S19 illustrated in FIG. 3.

According to the above-described third embodiment, when the storage device enters the device sleep state, whether or not the total number Tc of times the device sleep state is entered exceed the threshold Fc is determined. As a result, if the total number Tc exceeds the threshold Fc, the second device sleep processing is executed. Due to this, it is possible to reduce the number of writing times in the NAND memory 11, and to suppress the performance degradation of the NAND memory 11.

In addition, according to the third embodiment, the threshold Fc is calculated using the total power-on life time PLt, the product operation guarantee period Lt, or the like, and thereby it is possible to vary the threshold Fc. Due to this, it is possible to vary the time period required until the second device sleep processing is executed, and to achieve both prevention of the performance degradation of the NAND memory 11 and power consumption reduction.

Fourth Embodiment

A fourth embodiment determines the condition (3), and thereby the first device sleep processing or the second device sleep processing is executed.

As the condition (3), whether or not the number Pc of times the first device sleep processing is executed within the arbitrary time interval "It" exceeds the threshold Gc is determined.

An example of a calculation method of the threshold Gc, which is used for the condition (3), is illustrated in the following description.

Here, if the retainable times of the management information or the like of the system area is defined as Sc, an arbitrary time interval is defined as "It", and a product operation guarantee period is defined as Lt, a threshold Gc is represented by following Formula (6).

$$Gc = Sc \times (It/Lt) \qquad (6)$$

If Sc of Formula (6) is substituted with Formula (1), Gc is represented by following Formula (7).

$$Gc = ((Nc \times Ns)/Ss) \times (It/Lt) \qquad (7)$$

Here, Nc represents rewritable times in the NAND memory 11, Ns represents the size of an area on the NAND memory 11 secured for retaining the management information or the like of the system area, and Ss represents the retention size of the management information or the like of the system area per the device sleep.

Thus, if the number Pc of times the first device sleep processing is executed during the arbitrary time interval "It" does not exceed the threshold Gc, it is possible to continuously perform the first device sleep processing.

Meanwhile, each time the power supply is on or power-on life time Pt reaches the arbitrary time interval It×n (n is natural number), the number Pc of times the first device sleep processing is executed is initialized to "0", and each time the first device sleep processing is executed, Pc is increased. In addition, the arbitrary time interval "It" may be varied at an arbitrary timing after the power is on.

Operation of Fourth Embodiment

An operation of a fourth embodiment in which the condition (3) is used will be described with reference to FIGS. 9 and 10. Meanwhile, the same signs and reference numerals will be attached to the same parts as in the second and third embodiments, and description thereof will be omitted.

Figure 9:
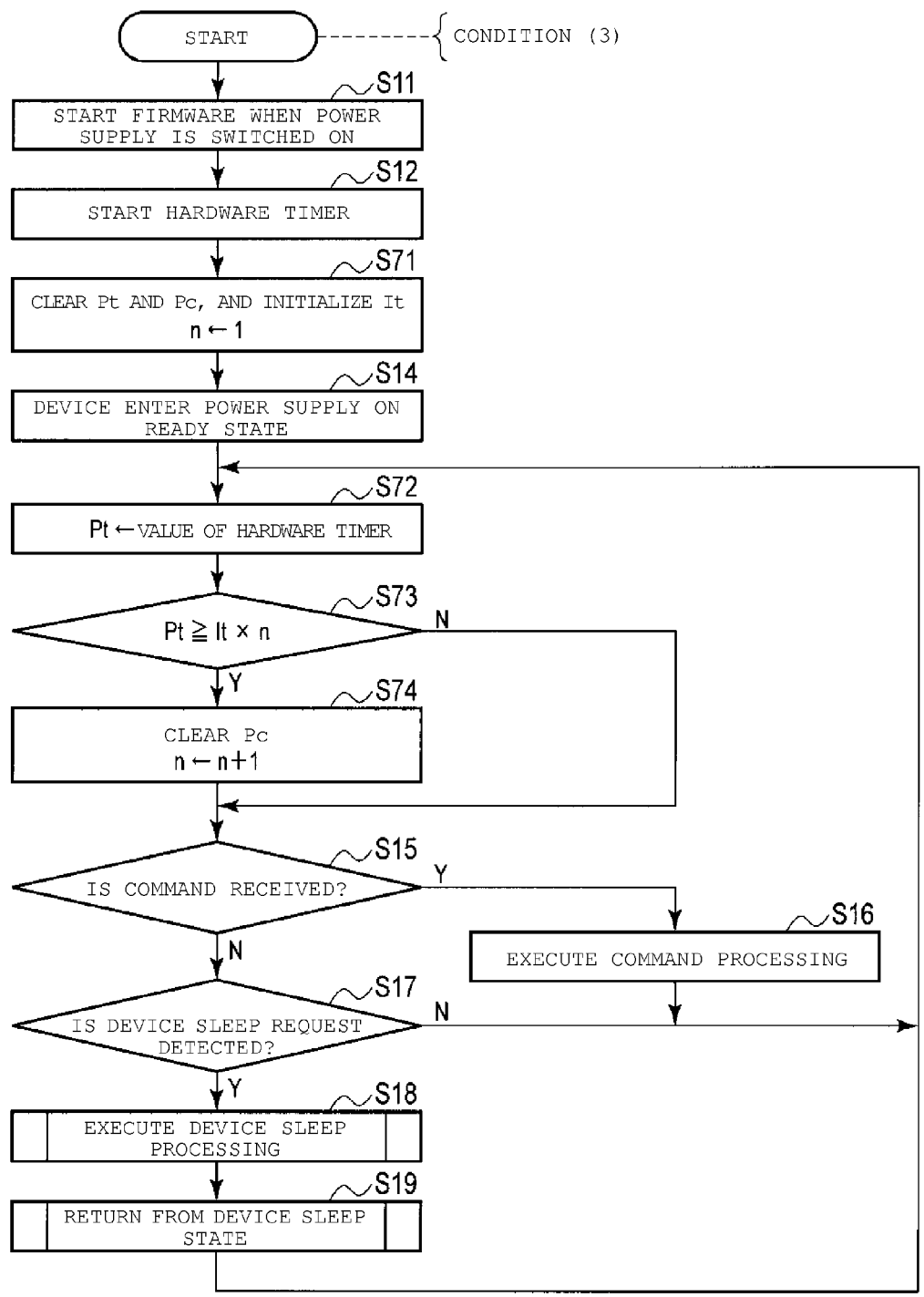
FIG. 9 is a flow chart schematically illustrating an operation according to a fourth embodiment.

As illustrated in FIG. 9, if the power supply to the hybrid drive 1 is on, the firmware starts in step S11, and the operation of the hardware timer is started in step S12. After that, the power-on life time Pt, and the number Pc of times the first device sleep processing is executed within the arbitrary time interval "It" are cleared, and the arbitrary time interval "It" is initialized to a constant value, and "n" is initialized to "1" (S71).

After the above-described initialization, the MPU 273 enters a ready state (S14).

Subsequently, the value of the hardware timer is set to the power-on life time Pt (S72).

After that, whether or not the power-on life time Pt is equal to or longer than the arbitrary time interval It×n is determined (S73). As a result, if the power-on life time Pt is equal to or longer than the arbitrary time interval It×n, the number Pc of times the first device sleep processing is executed is cleared to "0", and the value of "n" is increased (S74). In addition, in the determination of step S73, if the power-on life time Pt does not reach the arbitrary time interval It×n, step S74 is skipped.

Subsequently, steps S15 to S17 are executed, and in step S17, if a device sleep request is detected, the device sleep processing is executed (S18).

FIG. 10 illustrates execution of the device sleep processing according to the fourth embodiment.

In FIG. 10, the threshold Gc is first calculated using Formula (6) (S81).

After that, whether or not the number Pc of times the first device sleep processing is executed during the arbitrary time interval "It" does not exceed the threshold Gc is determined (S82). As a result, if the number Pc does not exceed the threshold Gc, the number Pc is increased (S83), and the preceding processing of the first device sleep processing illustrated in FIG. 5 is executed (S23). In addition, as a result of the determination, if the number Pc of times exceeds the threshold Gc, the preceding processing of the second device sleep processing illustrated in FIG. 6 is executed (S24).

As described above, after the preceding processing of the first or second device sleep processing is executed, the hybrid drive 1 enters the device sleep state through step S25 (S26). After that, if the return request from the device sleep state is detected (S27), the return processing from the device sleep is executed using step S19 illustrated in FIG. 9.

According to the fourth embodiment, when entering the device sleep state, whether or not the number Pc of times the first device sleep processing is executed within the arbitrary time interval "It" exceeds the threshold Gc is determined. As a result, if the number Pc exceeds the threshold Gc, the second device sleep processing is executed. Due to this, it is possible to reduce the number of writing times in the NAND memory 11, and to suppress the performance degradation of the NAND memory 11.

In addition, according to the fourth embodiment, it is possible to vary the arbitrary time interval "It". Due to this, it is possible to vary the time period required until the second device sleep processing is executed, and to achieve both prevention of the performance degradation of the NAND memory 11 and power consumption reduction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
  a nonvolatile memory;
  a volatile memory;
  a power supply control circuit configured to control power supply to the nonvolatile memory and the volatile memory; and
  a control circuit configured to control the power supply circuit to cut off the power supply to the nonvolatile memory and the volatile memory during a first operation that is carried out when a condition is satisfied, and control the power supply circuit to cut off the power supply to the nonvolatile memory and to maintain the power supply to the volatile memory during a second operation that is carried out when the condition is not satisfied, wherein
  the condition includes at least one of:
  i) a time period from a time when a last sleep state ended to a present time is equal to or smaller than a first threshold value,
  ii) a number of times the first operation has been carried out is equal to or smaller than a second threshold value, and
  iii) a number of times the first operation has been carried out in a predetermined time period is equal to or smaller than a third threshold value.

2. The storage device according to claim 1, wherein
  the control circuit is further configured to cause data stored in the volatile memory to be transferred to the nonvolatile memory before the power supply to the volatile memory is cut off.

3. The storage device according to claim 2, wherein
  the nonvolatile memory includes a nonvolatile semiconductor memory and a magnetic disk, and
  the data stored in the volatile memory is transferred to the nonvolatile semiconductor memory.

4. The storage device according to claim 1, wherein
  the control circuit carries out the first and second operations in response to a request from an external device to cause the storage device to enter into a sleep state.

5. The storage device according to claim 1, further comprising:
  a second volatile memory, wherein
  the control circuit is further configured to control the power supply circuit to cut off power supply to the second volatile memory during the first and second operations.

6. The storage device according to claim 5, wherein
  the control circuit is further configured to cause data stored in the second volatile memory to be transferred to the nonvolatile memory before the power supply to the nonvolatile memory and the power supply to the second volatile memory are cut off during the first operation.

7. The storage device according to claim 5, wherein
  the control circuit is further configured to cause data stored in the second volatile memory to be transferred to the volatile memory before the power supply to the second volatile memory is cut off during the second operation.

8. The storage device according to claim 5, wherein
  the volatile memory is an SDRAM, and
  the second volatile memory is an SRAM.

9. The storage device according to claim 1, wherein
  the nonvolatile memory is a nonvolatile semiconductor memory.

10. The storage device according to claim 1, wherein
  the control circuit carries out the first and second operations in response to assertion of a sleep signal, and
  the control circuit is further configured to control the power supply control circuit to resume the power supply to the nonvolatile memory and the volatile memory in response to negation of the sleep signal after the first operation, and the power supply to the nonvolatile memory in response to negation of the sleep signal after the second operation.

11. A method for processing a storage device including a nonvolatile memory and a volatile memory, the method comprising:
  cutting off power supply to the nonvolatile memory and the volatile memory during a first operation that is carried out when a condition is satisfied; and
  cutting off the power supply to the nonvolatile memory while maintaining the power supply to the volatile memory during a second operation that is carried out when the condition is not satisfied, wherein
  the condition includes at least one of:
  i) a time period from a time when a last sleep state ended to a present time is equal to or smaller than a first threshold value,
  ii) a number of times the first operation has been carried out is equal to or smaller than a second threshold value, and
  iii) a number of times the first operation has been carried out in a predetermined time period is equal to or smaller than a third threshold value.

12. The method according to claim 11, further comprising:

transferring data stored in the volatile memory to the nonvolatile memory before the power supply to the volatile memory is cut off.

13. The method according to claim 11, further comprising:
receiving a request from an external device to cause the storage device to enter into a sleep state, wherein
the first and second operations are carried out in response to receiving of the request.

14. The method according to claim 12, wherein
the nonvolatile memory includes a nonvolatile semiconductor memory and a magnetic disk, and
the data stored in the volatile memory is transferred to the nonvolatile semiconductor memory.

15. The method according to claim 11, wherein the storage device further includes a second volatile memory, the method further comprising:
cutting off power supply to the second volatile memory during the first and second operations.

16. The method according to claim 15, further comprising:
transferring data stored in the second volatile memory to the nonvolatile memory before the power supply to the nonvolatile memory and the power supply to the second volatile memory are cut off during the first operation.

17. The method according to claim 15, further comprising:
transferring data stored in the second volatile memory to the volatile memory before the power supply to the second volatile memory is cut off during the second operation.

18. The method according to claim 15, wherein
the volatile memory is an SDRAM, and
the second volatile memory is an SRAM.

19. The method according to claim 11, wherein
the nonvolatile memory is a nonvolatile semiconductor memory.

20. The method according to claim 11, wherein the first and second operations are carried out in response to assertion of a sleep signal, the method further comprising:
resuming the power supply to the nonvolatile memory and the volatile memory in response to negation of the sleep signal after the first operation; and
resuming the power supply to the nonvolatile memory in response to negation of the sleep signal after the second operation.

* * * * *